(12) United States Patent
Sell et al.

(10) Patent No.: US 7,943,992 B2
(45) Date of Patent: May 17, 2011

(54) METAL GATE STRUCTURES WITH RECESSED CHANNEL

(75) Inventors: Bernhard Sell, Portland, OR (US); Rishabh Mehandru, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 189 days.

(21) Appl. No.: 12/157,556

(22) Filed: Jun. 10, 2008

(65) Prior Publication Data

US 2009/0302398 A1 Dec. 10, 2009

(51) Int. Cl.
*H01L 29/76* (2006.01)

(52) U.S. Cl. ........ 257/330; 257/332; 257/334; 257/396; 257/E29.262; 438/270

(58) Field of Classification Search .......... 257/330–332, 257/344, 396, 408; 438/259, 270–271, 587–589
See application file for complete search history.

(56) References Cited

U.S. PATENT DOCUMENTS

| | | | | |
|---|---|---|---|---|
| 6,956,263 | B1 * | 10/2005 | Mistry | 257/330 |
| 7,655,522 | B2 * | 2/2010 | Kim et al. | 438/270 |
| 2009/0291541 | A1 * | 11/2009 | Jang et al. | 438/270 |
| 2010/0041197 | A1 * | 2/2010 | Yamamoto | 438/270 |

* cited by examiner

*Primary Examiner* — Dung A. Le
(74) *Attorney, Agent, or Firm* — Kathy J. Ortiz

(57) ABSTRACT

Methods and associated structures of forming a microelectronic device are described. Those structures may comprise a transistor comprising a metal gate disposed on a gate dielectric that is disposed on a substrate, and a source/drain region disposed adjacent a channel region of the transistor. The source/drain region comprises a source/drain extension comprising a vertex point, wherein a top surface of the channel region is substantially planar with the vertex point.

6 Claims, 4 Drawing Sheets

METAL GATE STRUCTURES WITH RECESSED CHANNEL

BACKGROUND OF THE INVENTION

Microelectronic devices are often manufactured in and on silicon wafers and on other types other substrates. Such microelectronic devices may include millions of transistors, such as metal oxide semiconductor (MOS) field effect transistors. Such transistors may include metal gate transistors comprising epitaxial extensions.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
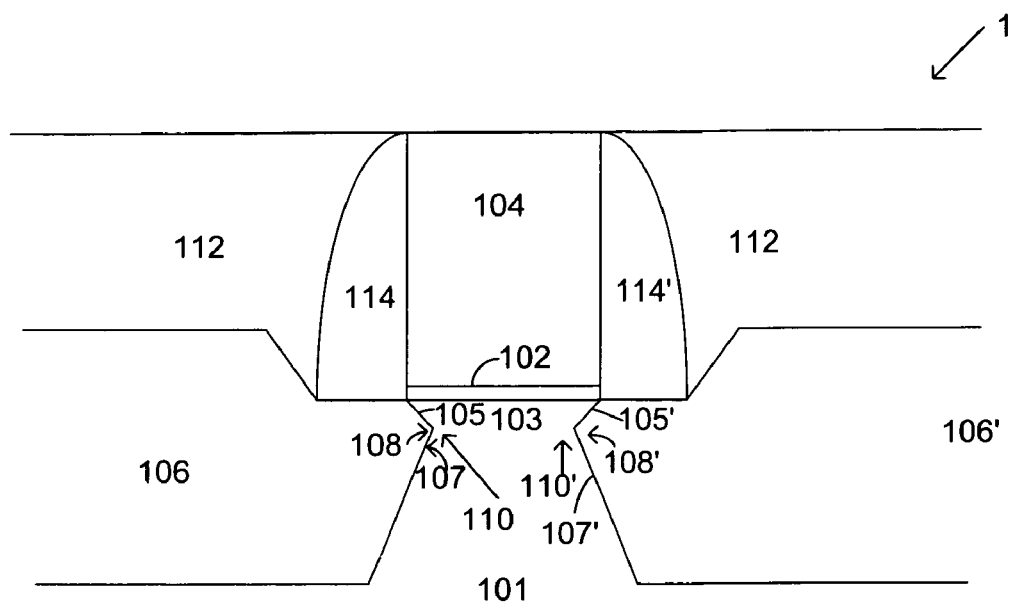
FIGS. 1a-1g represent structures according to an embodiment of the present invention.
Figure 1B:
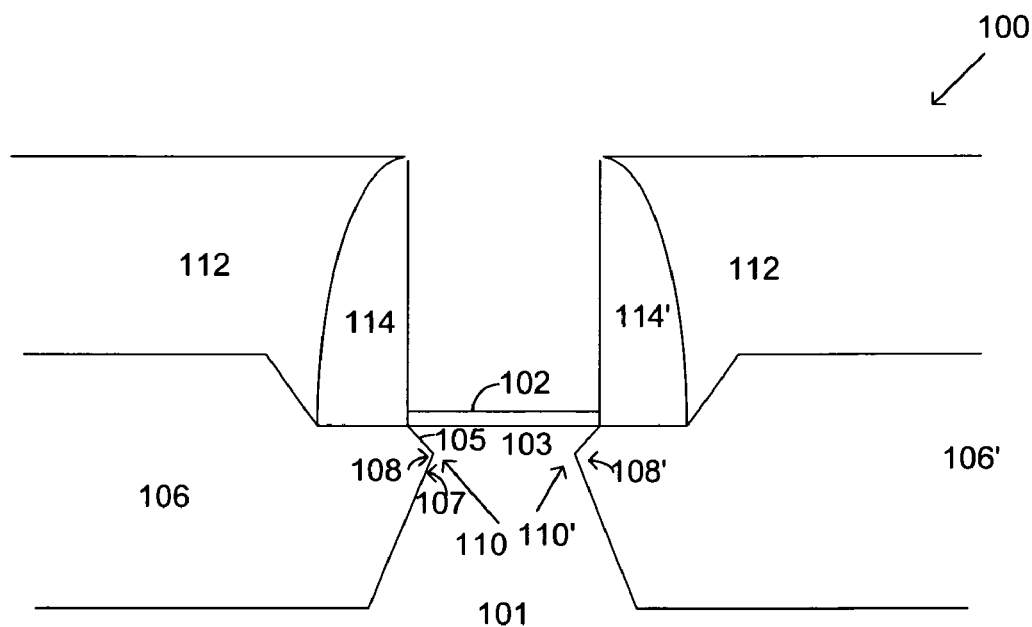

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure are described. Those methods include forming a transistor comprising a metal gate disposed on a gate dielectric that is disposed on a substrate, and a source/drain region disposed adjacent a channel region of the transistor. The source/drain region comprises a source/drain extension comprising a vertex point, wherein a top surface of the channel region is substantially planar with the vertex point. Embodiments of the present invention enable the improvement of the shape of source/drain extensions and reduces the source/drain leakage for a transistor structure.

FIGS. 1a-1g illustrate embodiments of methods and associated structures of the present invention. FIG. 1a illustrates a cross-section of a portion of a transistor 100 that may comprise a sacrificial metal gate material 104 disposed on a sacrificial gate dielectric 102, that may be disposed on a substrate 101. The substrate 101 may be disposed beneath the sacrificial gate dielectric 102, and may comprise a channel region 103, which may comprise a pre-etched channel region 103.

The substrate 101 may be comprised of materials such as, but not limited to, silicon, silicon-on-insulator, germanium, indium antimonide, lead telluride, indium arsenide, indium phosphide, gallium arsenide, gallium antimonide, or combinations thereof.

At least one source/drain region 106, 106' may be disposed adjacent the pre-etched channel region 103. The source/drain regions 106, 106' may comprise at least one of silicon, germanium and their alloys, in some embodiments. In one embodiment, at least one source/drain region 106, 106' may comprise epitaxial and/or implanted source/drain regions 106, 106' that may comprise source/drain extensions 108, 108'. The source/drain extensions 108, 108' may comprise regions wherein the source/drain regions 106, 106' extend underneath the gate dielectric 102. The transistor structure 100 may comprise adjacent pairs of source/drain extensions 108, 108'.

The source/drain extensions 108, 108' may comprise vertex points 110, 110' wherein an upper portion 105, 105' of each source/drain extension 108, 108' and a lower portion 107, 107' of each source/drain extension 108, 108' meet. Each source/drain extension 108, 108' of the transistor 100 may comprise the vertex points 110, 110'. Adjacent vertex points 110, 110' of adjacent source/drain extensions 108, 108' of the transistor structure 100 may be substantially planar with each other. The transistor structure 100 may further comprise spacers 114, 114' adjacent the sacrificial metal gate 104, and an interlayer dielectric (ILD) 112 adjacent the spacers 114, 114' in some embodiments. The transistor structure 100 may comprise a p-type transistor structure 100 such as a PMOS transistor, for example.

The sacrificial metal gate material 104 may be removed from the transistor structure 100 (FIG. 1b) using any suitable removal technique. For example, the sacrificial gate material 104 may be removed utilizing a wet or dry etch. In one embodiment, when the sacrificial metal gate 104 may comprise polysilicon, the polysilicon may be removed by utilizing a wet etch in a suitable chemistry and/or a dry etch with HBr/SF6 utilizing a reactive ion etch (RIE) process.

Figure 1C:
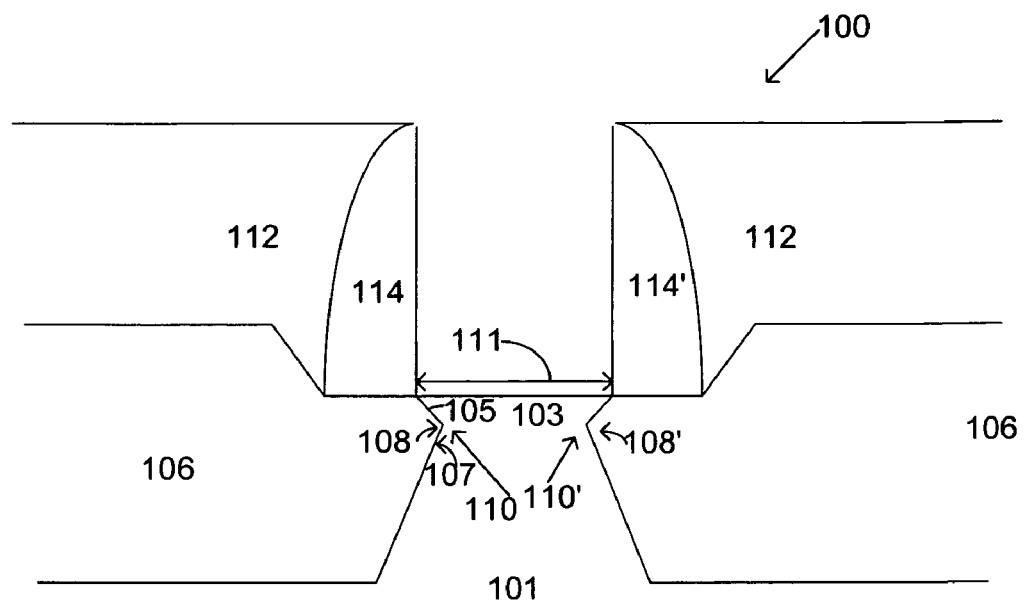
Figure 1D:
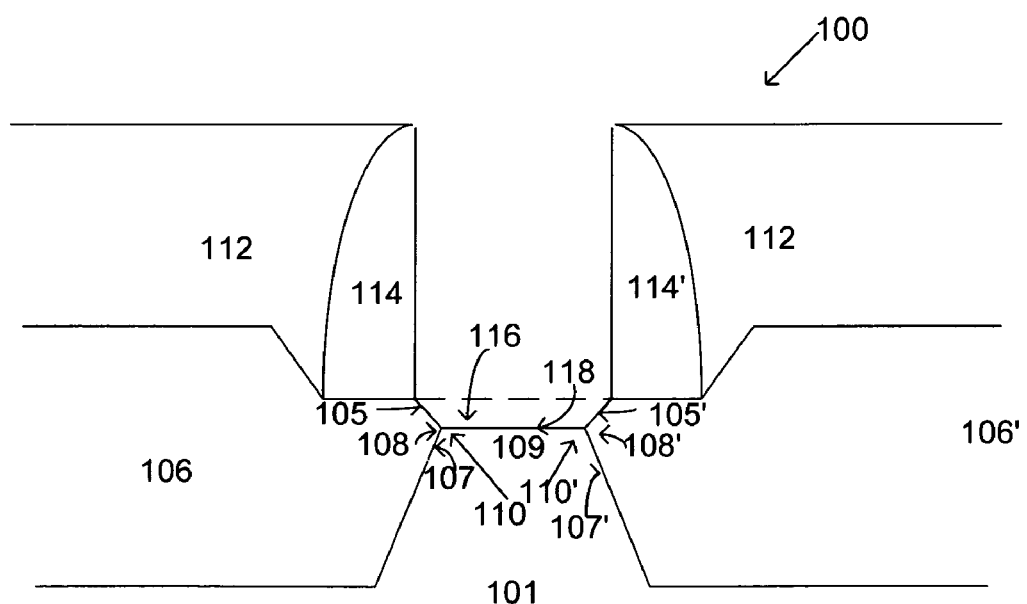

The sacrificial gate dielectric 102 may then be removed from the channel substrate region 103 of the substrate 101 (FIG. 1c). In one embodiment, hydrofluoric acid may be used to remove the sacrificial gate dielectric 102 material. In an embodiment, the pre-etched channel region 103 may comprise a pre-etched channel length 111. A portion 116 of the substrate 101 in the channel region 103 of the transistor structure 100 may be removed to form a recessed channel 109 region (FIG. 1d).

In one embodiment, the portion 116 of the substrate 101 may be removed by performing a timed wet etch in one embodiment, such as but not limited to a timed NH4OH etch. In another embodiment, the portion 116 of the substrate 101 may be removed by using a dry etch, such as but not limited to SF6, for example. In another embodiment, the portion 116 of the substrate 101 may be removed by forming an oxide (not shown) on/in the exposed substrate 101 that will convert the portion 116 of the substrate 101 into an oxide, and then removing the formed oxide from the substrate 101.

In one embodiment, the amount of the portion 116 of the substrate 101 that may be removed may correspond to about 20 to about 30 angstroms. The particular amount of the portion 116 of the substrate 101 to be removed will depend upon the particular application. In one embodiment, the portion 116 of the substrate 101 to be removed from the recessed channel region may comprise a portion 116 of the substrate 101 above a plane between the vertex points 110, 110'.

Figure 1E:
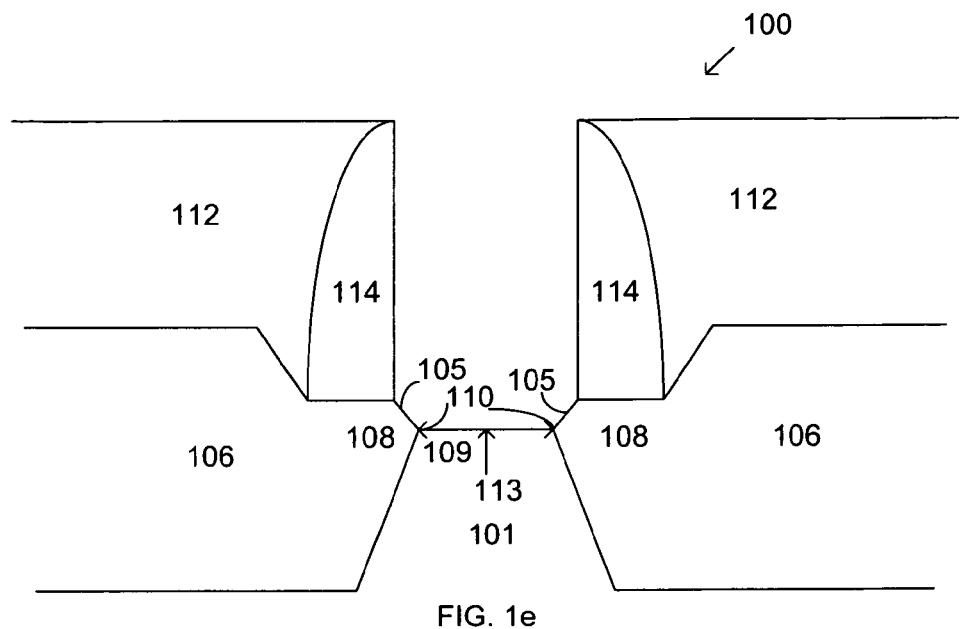

In one embodiment, the amount of the portion 116 of the substrate 101 to be removed may correspond to an amount sufficient to form the recessed channel region 109, wherein a top surface 118 of the recessed channel region 109 is substantially planar with the vertex points 110, 110' of the source/drain extensions 108, 108' of the transistor structure 100. In this manner, the amount of the portion 116 to be removed can be used to target the location of the recessed channel region 109 so that the pre-etched channel length 111 (FIG. 1c) of the transistor structure 100 may be reduced to form a recessed channel length 113 (FIG. 1e). The desired recessed channel length 113 and its location may vary according to the particular application.

In one embodiment, the recessed channel length 113 may comprise the distance between adjacent vertices 110, 110' of adjacent source/drain extensions 108, 108' within the transistor structure 100. The recessed channel region 109 enables the improvement of the shape of the source/drain tip extensions of the transistor structure 100 and therefore reduces the source/drain leakage for a given metallurgical channel length. The shorter channel length 113 of the recessed channel region 109 comprises a lower resistance. The shortest distance in the channel region is between the source/drain extension tips, and the source/drain leakage is dominated by this distance between the extension tips. Thus, by forming the recessed channel, the source/drain leakage can be controlled.

In an embodiment, the well doping dose concentration may be reduced to reduce the threshold voltage of the transistor structure 100 at a matched source/drain leakage value. Higher current is then made available for devices using the transistor structure 100 without increasing off-state leakage. Removing portions of the substrate 101 between the source/drain regions allows for the recessed channel to be compressed much more effectively. Because the overall compressive stress in the recessed channel region 109 becomes enhanced by the recessed channel formation, the on-state current of the transistor structure 100 may be increased.

Figure 1F:
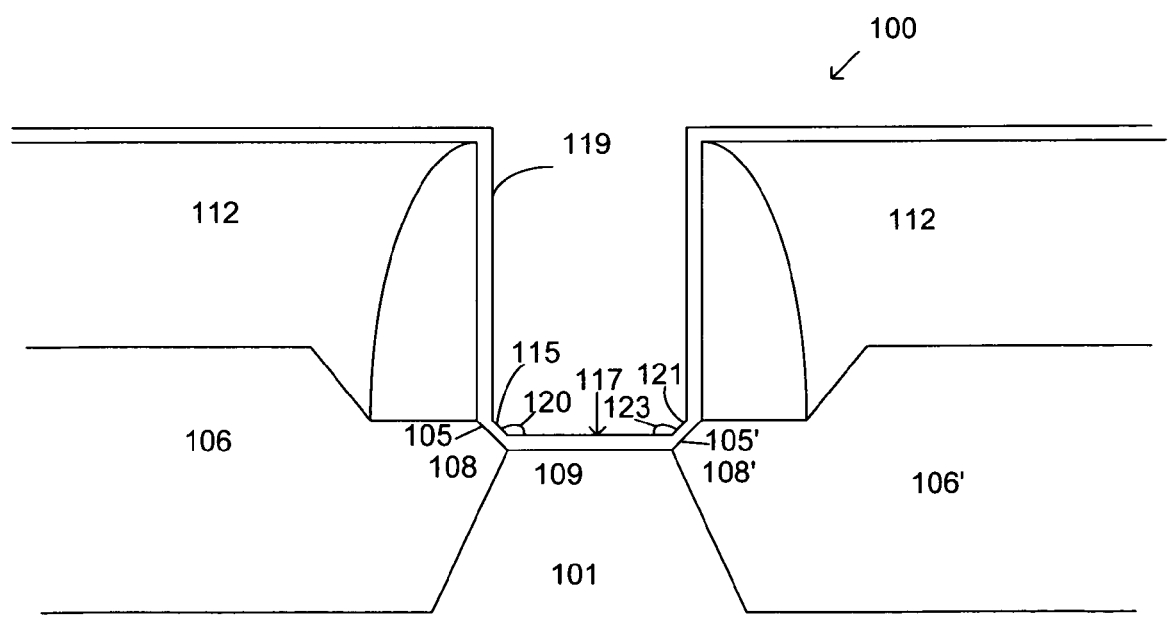
Figure 1G:
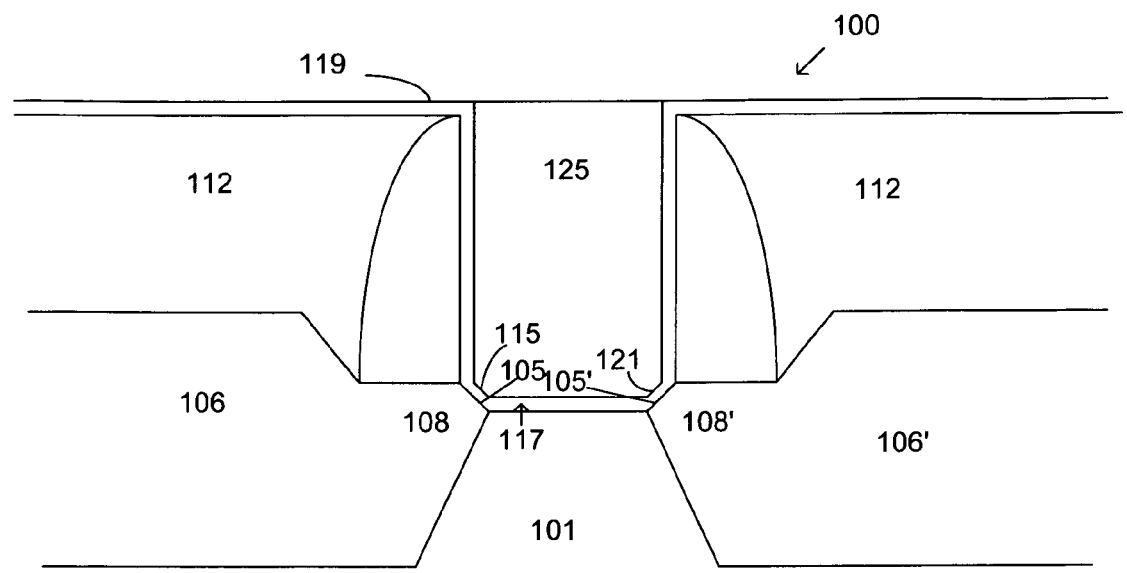

A gate dielectric 119 may be formed on the exposed portion of the substrate 101 and on the exposed upper portions 105, 105' of the source/drain extensions 108, 108' (FIG. 1f). The gate dielectric 119 may comprise a first segment 115 and a second segment 117 (and a third segment 121). The gate dielectric 119 may comprise an angle 120 disposed between the first segment 115 and the second segment 117. The angle 120 may vary depending upon the particular application, but may comprise between about 20 to about 35 degrees in some embodiments. A second angle 123 may be disposed between the second segment 117 and the third segment 121. A metal gate material 125, which may comprise a replacement metal gate material, may be formed on the gate dielectric 119 (FIG. 1g). The replacement metal gate material 125 may comprise Titanium, Platinum, Iridium, Ruthenium, Palladium, Tantalum, Aluminum or any combination or any silicide, nitride or oxide of these metals, in an embodiment.

Figure 1H:
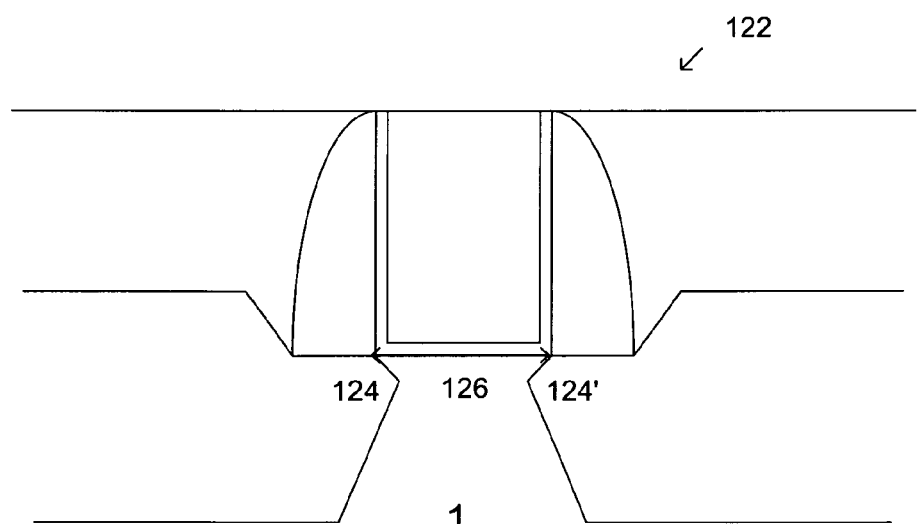
FIG. 1h represents structures according to the Prior Art.

FIG. 1h depicts a Prior Art replacement metal gate transistor structure 122 with source/drain extensions 124, 124' and having a non recessed channel region 126. The non-ideal source/drain extension, non-recessed channel shape of the prior art structure 122 tends to degrade the short channel effect of the prior art transistor 122. Prior art source/drain extensions 124 have typically been made after the formation of the replacement metal gate and before the deposition of the final gate dielectric. The prior art methods typically leave the extensions in an imperfect shape which increases the source/drain leakage. Prior art processes have corrected for this leakage by increasing the source/drain well doping concentration. This increased doping is undesirable since it also increases the threshold voltage of the transistor.

The various embodiments of the present invention improve the short channel effects of the transistor which will enable the reduction of the threshold voltage at the same source/drain leakage. In addition, the various embodiments of the present invention enhance the compressive stress exerted by the source/drain region by removing a portion of the substrate, thus allowing the transistor to operate at higher current levels. The shorter channel length of the recessed channel allows for a higher drive current at a given source/drain leakage.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that a microelectronic device, such as a transistor is well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A structure comprising:
   a transistor comprising a metal gate disposed on a gate dielectric that is disposed on a substrate; and
   a source/drain region disposed adjacent a channel region of the transistor, wherein the source/drain region comprises a source/drain extension comprising a vertex point, wherein an upper portion of the source/drain extension and a lower portion the source/drain extension meet, and wherein a top surface of the channel region is substantially planar with the vertex point, and wherein the gate dielectric is disposed on the upper portion of the source/drain extension and wherein the gate dielectric is not disposed on a planar portion of the source/drain extension.

2. The structure of claim 1 wherein the metal gate comprises a p type gate material.

3. The structure of claim 1 wherein the transistor structure comprises a PMOS transistor.

4. The structure of claim 1 wherein a length of the channel comprises a distance between adjacent vertices of adjacent source/drain extensions within the structure.

5. The structure of claim 1 wherein the gate dielectric comprises a first segment and a second segment.

6. The structure of claim 5 wherein the gate dielectric comprises an angle disposed between the first segment and the second segment.

* * * * *